(12) United States Patent
Cheng et al.

(10) Patent No.: US 8,598,679 B2
(45) Date of Patent: Dec. 3, 2013

(54) STACKED AND TUNABLE POWER FUSE

(75) Inventors: Chih-Chang Cheng, Hsinchu (TW);
Ruey-Hsin Liu, Hsin-Chu (TW); Ru-Yi Su, Kouhu Township (TW); Fu-Chih Yang, Fengshan (TW); Chun Lin Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 370 days.

(21) Appl. No.: 12/956,025

(22) Filed: Nov. 30, 2010

(65) Prior Publication Data
US 2012/0132995 A1 May 31, 2012

(51) Int. Cl.
*H01L 23/52* (2006.01)
(52) U.S. Cl.
USPC .............. 257/529; 257/E23.149; 438/601
(58) Field of Classification Search
USPC ............ 257/209, 379, 489, 529, E23.149, 257/E21.592; 438/132, 215, 281, 467, 601
See application file for complete search history.

(56) References Cited

U.S. PATENT DOCUMENTS

| | | | | |
|---|---|---|---|---|
| 4,814,646 A * | 3/1989 | Hoberman et al. | ............ | 326/43 |
| 5,457,059 A * | 10/1995 | Keller et al. | .................. | 438/601 |
| 5,627,400 A * | 5/1997 | Koga | ............................. | 257/529 |
| 6,525,390 B2 * | 2/2003 | Tada et al. | ..................... | 257/489 |
| 6,649,997 B2 * | 11/2003 | Koike | ........................... | 257/529 |
| 2005/0068706 A1* | 3/2005 | Lewis | .......................... | 361/100 |
| 2005/0180079 A1* | 8/2005 | Joseph Gaudreau et al. | . | 361/104 |
| 2006/0049466 A1* | 3/2006 | Egawa et al. | ................. | 257/379 |
| 2006/0197179 A1* | 9/2006 | Park et al. | ..................... | 257/529 |
| 2006/0289898 A1* | 12/2006 | Kono et al. | .................. | 257/209 |
| 2007/0007621 A1* | 1/2007 | Omura et al. | ................. | 257/529 |
| 2008/0068047 A1* | 3/2008 | Hashimoto | ..................... | 327/88 |
| 2008/0237865 A1* | 10/2008 | Wang et al. | .................... | 257/753 |

* cited by examiner

*Primary Examiner* — William F Kraig
(74) *Attorney, Agent, or Firm* — Haynes and Boone, LLP

(57) ABSTRACT

The present disclosure provides a semiconductor device that includes a transistor including a substrate, a source, a drain, and a gate, and a fuse stacked over the transistor. The fuse includes an anode contact coupled to the drain of the transistor, a cathode contact, and a resistor coupled to the cathode contact and the anode contact via a first Schottky diode and a second Schottky diode, respectively. A method of fabricating such semiconductor devices is also provided.

20 Claims, 4 Drawing Sheets

STACKED AND TUNABLE POWER FUSE

BACKGROUND

In the design of semiconductor integrated circuits (ICs), electrical fuses have been developed to prevent damage to a device that encounters a voltage greater than the device capacity to function. If a voltage exceeds an intended limit, the electrical fuse will blow or interrupt excessive current or voltage so that the device is not damaged.

Prior electrical fuses have combined a transistor element and a fuse element but in an inefficient manner so as not to be area-effective. Furthermore, the fuse blowing voltage of prior electrical fuses has been fixed and not variable or not tunable to include multiple fuse blowing voltages.

Accordingly, methods of electrical fuse fabrication and devices fabricated by such methods are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
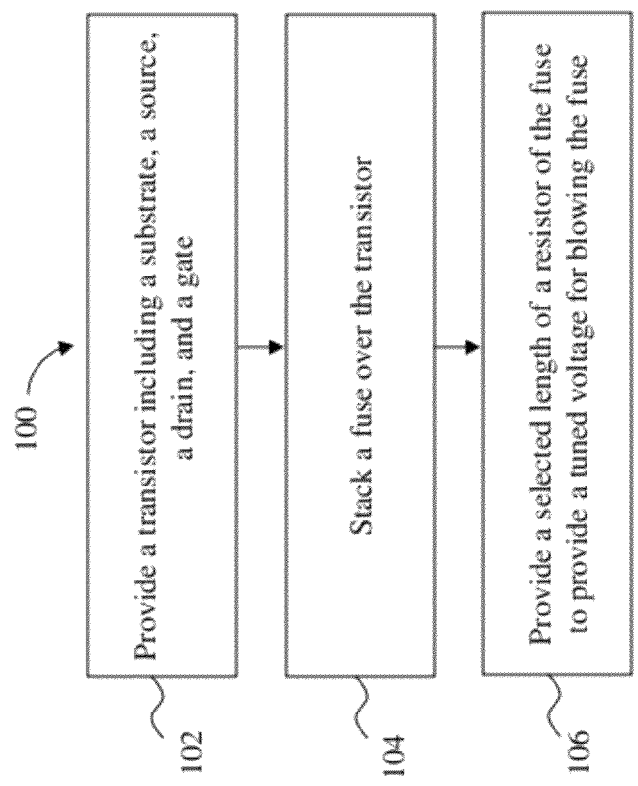
FIG. 1 is a flowchart illustrating a method for fabricating a semiconductor device with improved footprint and tuned fuse blowing voltage capability according to various aspects of the present disclosure.
Figure 2A:
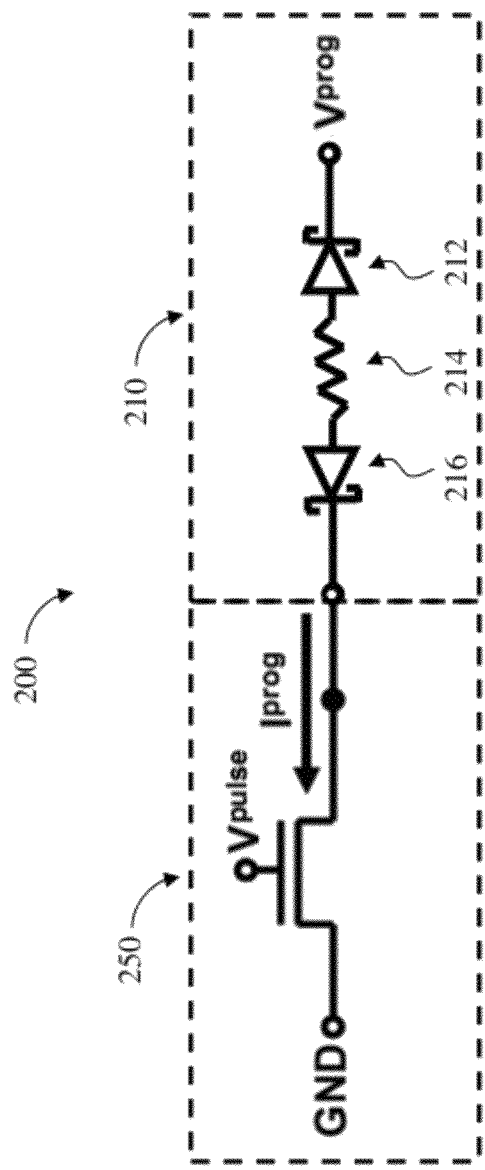
FIG. 2A is an example circuit diagram of an electrical fuse semiconductor device according to the various aspects of the present disclosure.
Figure 2B:
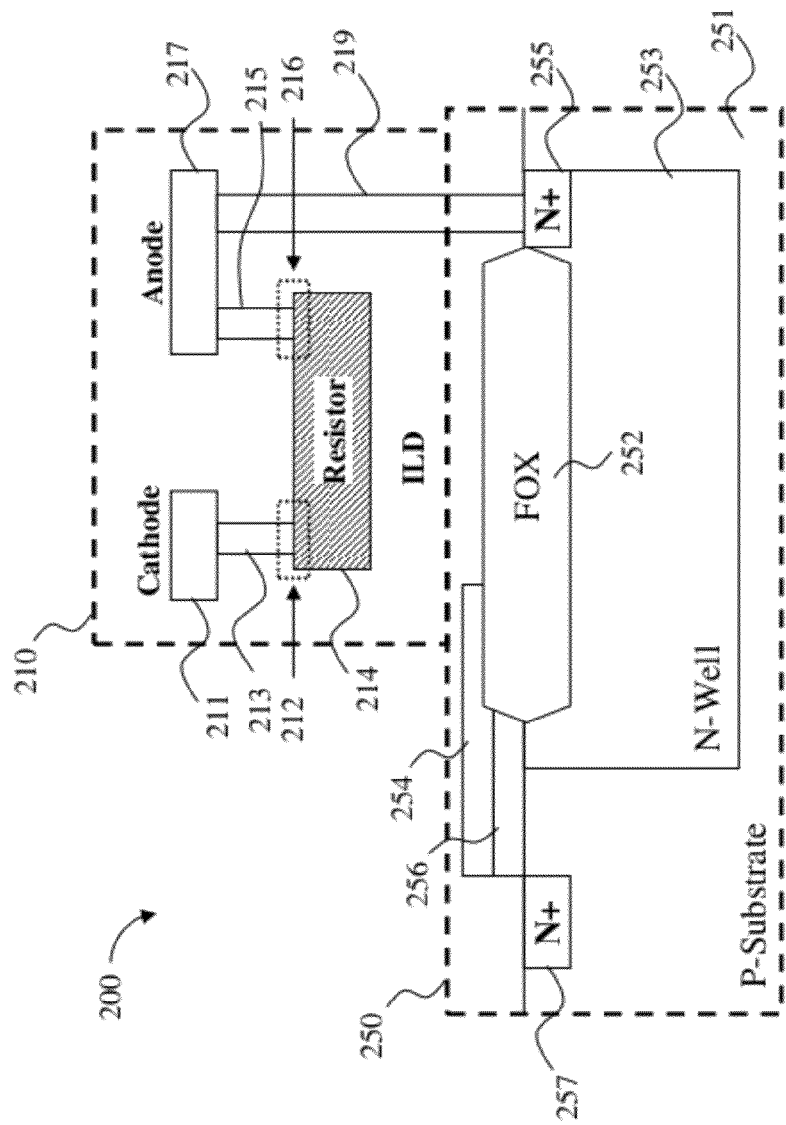
FIG. 2B is a cross-sectional view of an embodiment of an electrical fuse semiconductor device according to various aspects of the present disclosure.
Figure 3:
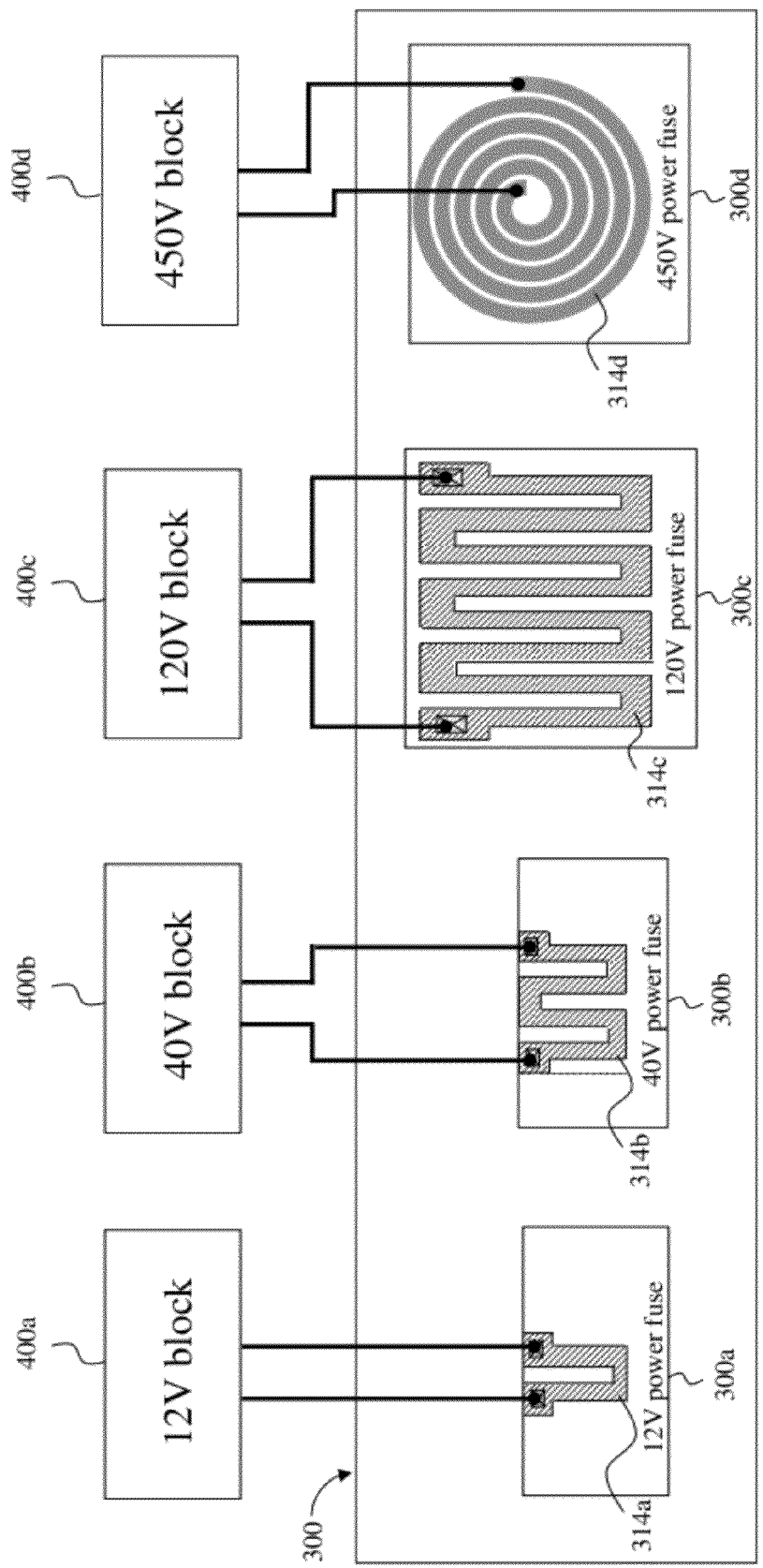
FIG. 3 is a block diagram of an embodiment of a semiconductor device including multiple fuse blowing voltage capability according to various aspects of the present disclosure.

Referring to the figures, FIG. 1 illustrates a method 100 for fabricating a semiconductor device with improved footprint and tuned fuse blowing voltage capability according to various aspects of the present disclosure. FIG. 2A illustrates an example circuit diagram of an electrical fuse semiconductor device 200 according to the various aspects of the present disclosure, and FIG. 2B illustrates a cross-sectional view of an embodiment of the electrical fuse semiconductor device 200 according to various aspects of the present disclosure. FIG. 3 is a block diagram of an embodiment of a semiconductor device 300 including multiple fuse blowing voltage capability according to various aspects of the present disclosure.

It should be noted that part of the semiconductor devices 200 and 300 may be fabricated with a CMOS, NMOS, and/or PMOS process flow. Accordingly, it is understood that additional processes may be provided before, during, and after the method 100 of FIG. 1, and that some other processes may only be briefly described herein.

Referring now to FIG. 1, method 100 begins with block 102 in which a transistor is provided. In an embodiment, the transistor includes a substrate, a source, a drain, and a gate. The method 100 continues with block 104 in which a fuse is stacked over or above the transistor. In an embodiment, the fuse includes an anode metal contact coupled to the drain of the transistor, a cathode metal contact, and a resistor coupled to the cathode metal contact and the anode metal contact via a first Schottky diode and a second Schottky diode, respectively. The method 100 continues with block 106 in which a length of the resistor of the fuse is selected to provide a tuned voltage for blowing of the fuse. In one example, the tuned voltage for blowing of the fuse may be between about 20 V and about 700 V.

As noted above, it is understood that additional processes may be provided before, during, and after the method 100 of FIG. 1. For example, a dielectric layer may be formed between the gate of the transistor and the resistor of the fuse, and other elements such as contact bars, metal layers, vias, interlayer dielectrics, and passivation layers may be formed above the active region of the transistor or in other areas of the device.

According to other aspects of the present disclosure, the anode metal contact, the cathode metal contact, and the resistor of the fuse may be stacked over and between the gate and the drain of the transistor. Furthermore, the first Schottky diode may be embedded between the resistor and the cathode metal contact, and the second Schottky diode may be embedded between the resistor and the anode metal contact.

According to other aspects of the present disclosure, an isolation structure may be provided between the gate and the drain of the transistor, wherein the isolation structure and the drain are within a n-well within the substrate, and the substrate is doped with a p-type dopant.

According to yet other aspects of the present disclosure, a plurality of transistors may be provided and a plurality of fuses may be stacked over the plurality of transistors. In one embodiment, the resistors of the plurality of fuses have different lengths from one another, and each fuse of the plurality of fuses is configured to blow at a different voltage, thereby providing a multiple voltage power management IC in one example.

Referring now to FIG. 2A, an example circuit diagram illustrates a semiconductor device 200 according to various aspects of the present disclosure. Device 200 functions as an electrical fuse including a fuse 210 operably coupled to a transistor 250. Fuse 210 includes a first Schottky diode 212 coupled to a first end of a resistor 214, and a second Schottky diode 216 coupled to a second end of resistor 214. Resistor 214 may be formed to have a tuned resistance to provide a selected fuse blowing voltage, in one example between about 20 V and about 700 V. The first Schottky diode 212 may be embedded between the resistor 214 and a cathode contact in one example, and the second Schottky diode 216 may be embedded between the resistor 214 and an anode contact in one example.

Referring now to FIG. 2B, a cross-sectional view is illustrated of an embodiment of the electrical fuse semiconductor device 200 according to various aspects of the present disclosure. Semiconductor device 200 includes fuse 210 stacked over or above and operably coupled to transistor 250. In one embodiment, transistor 250 is fabricated as a high-voltage transistor but in other embodiments may be fabricated with a CMOS, NMOS, and/or PMOS process flow.

Fuse 210 includes a cathode contact 211 operably coupled to resistor 214 by via 213 at a first end of resistor 214, and an anode contact 217 operably coupled to resistor 214 by via 215 at a second end of resistor 214. In one example, cathode contact 211 and anode contact 217 may be comprised of various metals, such as but not limited to copper, aluminum, or alloys thereof. Vias 213 and 215 may be metal-filled vias comprised of various metals, such as but not limited to copper, aluminum, or alloys thereof. Resistor 214 may be comprised of polysilicon in one example, and may be formed to have a specified resistance or a specified length to cause a tunable voltage drop and to thereby tune the fuse blowing voltage of the fuse 210. In one embodiment, resistor 214 may include a plurality of turns as will be described in greater detail below with respect to FIG. 3.

In one embodiment, first Schottky diode 212 is formed between the resistor 214 and the via 213 or the cathode contact 211, and second Schottky diode 216 is formed between the resistor 214 and the via 215 or the anode contact 217, by doping a first end contact area and a second end contact area of the resistor 214, respectively, with a low doping concentration of a dopant. An n-type dopant, such as phosphorus or boron, may be doped at the first end and second end contact areas of the resistor 214 at a concentration between about $1E12$ $cm^{-3}$ and about $1E13$ $cm^{-3}$ in one example.

Transistor 250 includes a substrate 251, a drain 255, a gate 254, and a source 257. Anode contact 217 is operably coupled to drain 255 by a via 219, which in one example is a metal-filled via comprised of various metals, such as but not limited to copper, aluminum, or alloys thereof.

In one embodiment, substrate 251 is a semiconductor substrate and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multi-layer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

In one embodiment, substrate 251 is doped with a p-type dopant, and an n-well 253 is formed within the substrate 251. N-well 253 may be formed by doping substrate 251 with various n-type dopants, such as phosphorus, at a concentration between about $1E12$ $cm^{-2}$ and about $1E13$ $cm^{-2}$, in one example. N-well 253 allows for a voltage drop across the n-well up to about 400 V or more, in one example. In yet another example, the device 200 may be configured to blow at a voltage between about 20 V and about 700 V.

In one embodiment, drain 255 and source 257 may be formed by doping with a n-type dopant, such as phosphorus, arsenic, or antimony, at an implant energy between about 5 keV and about 50 keV. Drain 255 is within n-well 253 in one example. An active region may be formed in the substrate 251 between drain 255 and source 257. An isolation structure 252, such as a shallow trench isolation (STI) structure or a local oxidation of semiconductor (LOCOS) structure, is formed between the drain 255 and source 257 and over the n-well 253. Isolation structure 252 may be comprised of an oxide in one example. Gate 254 is formed between isolation structure 252 and source 257 over an active region of the substrate 251. Gate 254 may be formed over a gate dielectric 256. In one example, gate 254 may be comprised of polysilicon and gate dielectric 256 may be comprised of a thermal oxide. Both gate 254 and gate dielectric 256 may be formed and defined by conventional deposition, photolithography patterning, and etch techniques, in one example. Isolation structure 252 is also formed between the drain 255 and the gate 254 in one example.

A dielectric layer is disposed over drain 255, the isolation structure 252, the gate 254, and the source 257. In one example, the dielectric layer is disposed between the gate 254 of the transistor 250 and the resistor 214 of the fuse 210. The dielectric layer may be comprised of various dielectrics, such as various oxides, and may be formed by various conventional deposition and/or growth techniques and processes, such as a high aspect ratio process (HARP) and/or a high density plasma (HDP) CVD process.

As shown in FIG. 2B, in one embodiment, the anode contact 217, the cathode contact 211, and the resistor 214 of the fuse 210 are disposed over and between the gate 254 and the drain 255 of the transistor 250.

Referring now to FIG. 3, a block diagram illustrates an embodiment of a semiconductor device 300 including a plurality of electrical fuses (such as devices 200), with each electrical fuse having a different length of fuse resistor to provide a multiple fuse blowing voltage capability according to various aspects of the present disclosure.

Device 300 functions as a multiple voltage power management device and includes a first electrical fuse 300a, a second electrical fuse 300b, a third electric fuse 300c, and a fourth electrical fuse 300d. Electrical fuses 300a, 300b, 300c, and 300d are each substantially similar to electrical fuse device 200 as shown and described above with respect to FIGS. 2A and 2B, and similar elements may be numbered similarly although repetitive descriptions may not be included here to avoid prolix description although fully applicable in this embodiment. Each electrical fuse 300a, 300b, 300c, and 300d includes a transistor element (not shown) and a fuse element. Electrical fuses 300a, 300b, 300c, and 300d each include a respective fuse resistor 314a, 314b, 314c, and 314d. The fuse resistors are electrically coupled to cathode contacts and anode contacts through Schottky diode contacts and vias, similar to the electrical fuse device 200 of FIGS. 2A and 2B.

Electrical fuses 300a, 300b, 300c, and 300d are shown as electrically coupled to different devices 400a, 400b, 400c, and 400d, respectively, that can operate up to 12 V, 40 V, 120 V, and 450 V, respectively. Electrical fuses 300a, 300b, 300c, and 300d are configured to blow at 12 V, 40 V, 120 V, and 450 V, respectively, such that the devices 400a, 400b, 400c, and 400d are not damaged if a higher voltage is encountered than the device capacity allows. Fuse resistor 314a, 314b, 314c, and 314d each include a turn of the fuse resistor (from a top view), and resistors 314b, 314c, and 314d each include a plurality of turns (from a top view) for increasing the length of the respective resistor to tune the fuse blowing voltage of each electrical fuse. In one embodiment, a greater number of turns and length of the fuse resistor increases the fuse blowing voltage level of the electrical fuse. Accordingly, the fuse resistors of the plurality of electrical fuses 300a, 300b, 300c, and 300d have different lengths from one another, and each electrical fuse of the plurality of electrical fuses is configured to blow at a different voltage.

Although 12 V, 40 V, 120 V, and 450 V are illustrated in FIG. 3, these voltage levels are only illustrative and do not limit the present disclosure. In other embodiments, device 300 may include electrical fuses having the same fuse blowing voltage as well electrical fuses having different fuse blowing voltages.

Advantageously, stacking a fuse element over a transistor element decreases the footprint of an electrical fuse according to the present disclosure, thereby increasing area efficiency and saving silicon area. Furthermore, the electrical fuse of the present disclosure provides for a tunable fuse blowing voltage based upon a tunable fuse resistor length, and therefore provides for a multiple voltage power management device.

As noted above, it is understood that additional processes may be provided before, during, and after the formation of dielectric layer 514. For example, after the dielectric layer is formed, contact bars, metal layers, vias, interlayer dielectrics, and passivation layers may be formed above the active region. Additional processes such as chemical mechanical polish and wafer acceptance testing processes may be subsequently performed as well. It is further noted that where a particular p-type or n-type dopant is described above, the complementary type of dopant may be used (i.e., p-type and n-type dopants may be switched in the descriptions above).

The present disclosure provides for many different embodiments. One of the broader forms of the present disclosure involves a semiconductor device. The semiconductor device includes a transistor including a substrate, a source, a drain, and a gate, and a fuse stacked over the transistor. The fuse includes an anode contact coupled to the drain of the transistor, a cathode contact, and a resistor coupled to the cathode contact and the anode contact via a first Schottky diode and a second Schottky diode, respectively.

Another of the broader forms of the present disclosure involves a semiconductor device including a plurality of transistors, each transistor including a substrate, a source, a drain, and a gate. The device further includes a plurality of fuses, with each fuse stacked over a respective transistor of the plurality of transistors. Each fuse includes an anode metal contact coupled to the drain of the respective transistor, a cathode metal contact, and a resistor coupled to the cathode metal contact and the anode metal contact via a first Schottky diode and a second Schottky diode, respectively. The resistors of the plurality of fuses have different lengths from one another.

Another of the broader forms of the present disclosure involves a method of fabricating a semiconductor device. The method includes providing a transistor including a substrate, a source, a drain, and a gate, and stacking a fuse over the transistor. The fuse includes an anode metal contact coupled to the drain of the transistor, a cathode metal contact, and a resistor coupled to the cathode metal contact and the anode metal contact via a first Schottky diode and a second Schottky diode, respectively.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
    a transistor including a substrate, a source, a drain, and a gate, wherein the source is grounded; and
    a fuse stacked over the transistor, the fuse including:
        an anode contact coupled to the drain of the transistor;
        a cathode contact, wherein the cathode contact is connected to a signal line; and
        a resistor coupled to the cathode contact and the anode contact via a first Schottky diode and a second Schottky diode, respectively, and
        wherein the fuse is configured to blow at a voltage between about 20 V and about 700 V.

2. The semiconductor device of claim 1, wherein the anode contact, the cathode contact, and the resistor of the fuse are disposed over and between the gate and the drain of the transistor.

3. The semiconductor device of claim 1, wherein the transistor includes an isolation structure disposed between the gate and the drain, the isolation structure and the drain being within a n-well within the substrate, and the substrate being doped with a p-type dopant.

4. The semiconductor device of claim 1, wherein the resistor includes a plurality of turns.

5. The semiconductor device of claim 1, wherein the first Schottky diode is embedded between the resistor and the cathode contact, and the second Schottky diode is embedded between the resistor and the anode contact.

6. The semiconductor device of claim 1, further comprising a dielectric layer between the gate of the transistor and the resistor of the fuse.

7. The semiconductor device of claim 1, wherein the cathode contact does not physically contact the source.

8. The semiconductor device of claim 1, wherein the gate is connected to a pulse signal line.

9. The semiconductor device of claim 1, wherein a dielectric isolation structure extends between the source and the drain, and
    wherein a first portion of the gate is formed directly over the dielectric isolation structure and a second portion of the gate structure is formed directly over an active region of the substrate.

10. A semiconductor device, comprising:
    a plurality of transistors, each transistor including a substrate, a source, a drain, and a gate; and
    a plurality of fuses, each fuse stacked over a respective transistor of the plurality of transistors, each fuse including:
        an anode metal contact coupled to the drain of the respective transistor;
        a cathode metal contact; and
        a resistor coupled to the cathode meta contact and the anode metal contact via a first Schottky diode and a second Schottky diode, respectively,
    wherein the resistors of the plurality of fuses have different lengths from one another, and
    wherein each fuse is configured to blow at a voltage between about 20 V and about 700V.

11. The semiconductor device of claim 10, wherein the anode metal contact, the cathode metal contact, and the resistor of each fuse are disposed over and between the gate and the drain of each respective transistor.

12. The semiconductor device of claim 10, wherein each transistor includes an isolation structure disposed between the gate and the drain, the isolation structure and the drain being within a n-well within the substrate, and the substrate being doped with a p-type dopant.

13. The semiconductor device of claim 10, wherein each resistor includes a plurality of turns.

14. The semiconductor device of claim 10, wherein the first Schottky diode is embedded between the resistor and the cathode metal contact, and the second Schottky diode is embedded between the resistor and the anode metal contact.

15. A method of fabricating a semiconductor device, the method comprising:
    providing a transistor including a substrate, a source, a drain, and a gate; and
    stacking a fuse over the transistor, the fuse including:
        an anode metal contact coupled to the drain of the transistor;
        a cathode metal contact; and
        a resistor coupled to the cathode metal contact and the anode metal contact via a first Schottky diode and a second Schottky diode, respectively.
    providing a selected length of the resistor to provide a tuned voltage for blowing the fuse, wherein the tuned voltage is between about 20 V an about 700 V.

16. The method of claim 15, wherein stacking the fuse over the transistor includes stacking the anode metal contact, the cathode metal contact, and the resistor of the fuse over and between the gate and the drain of the transistor, and wherein the first Schottky diode is embedded between the resistor and the cathode metal contact, and the second Schottky diode is embedded between the resistor and the anode metal contact.

17. The method of claim 15, wherein providing the transistor includes providing an isolation structure between the gate and the drain, the isolation structure and the drain being within a n-well within the substrate, and the substrate being doped with a p-type dopant.

18. The method of claim 15, further comprising providing a plurality of transistors and stacking a plurality of fuses over the plurality of transistors.

19. The method of claim 18, wherein resistors of the plurality of fuses have different lengths from one another, and each fuse of the plurality of fuses is configured to blow at a different voltage.

20. The method of claim 15, further comprising:
    forming an isolation structure between the source and drain, and
    forming an inter-layer dielectric (ILD) layer over the transistor, wherein the ILD layer is disposed between the isolation structure and the resistor.

* * * * *